United States Patent [19]
Lo et al.

[11] Patent Number: 5,804,982
[45] Date of Patent: Sep. 8, 1998

[54] MINIATURE PROBE POSITIONING ACTUATOR

[75] Inventors: Jiann-Chang Lo; Michael Servedio; James Michael Hammond, all of Boca Raton, Fla.

[73] Assignee: International Business Machines Corporation, Armonk, N.Y.

[21] Appl. No.: 451,634

[22] Filed: May 26, 1995

[51] Int. Cl.⁶ .................................................. G01R 1/06
[52] U.S. Cl. ........................ 324/758; 324/754; 335/266
[58] Field of Search ............................. 324/72.5, 158.1, 324/73.5, 754, 758, 761, 149; 310/12, 13, 14; 335/253, 295, 229, 266, 268, 78

[56] References Cited

U.S. PATENT DOCUMENTS

| | | | |
|---|---|---|---|
| 3,446,065 | 5/1969 | Wiesler et al. | 73/105 |
| 3,970,980 | 7/1976 | Nelson | 335/253 |
| 4,001,685 | 1/1977 | Roch | 324/158 |
| 4,034,293 | 7/1977 | Roch | 324/158 |
| 4,123,706 | 10/1978 | Roch | 324/158 |
| 4,267,507 | 5/1981 | Guerpont | 324/158 |
| 5,041,806 | 8/1991 | Enderle et al. | 335/295 |
| 5,153,472 | 10/1992 | Karadis et al. | 310/13 |
| 5,373,730 | 12/1994 | Kovacevic | 73/81 |

FOREIGN PATENT DOCUMENTS 401232272 9/1989 Japan .............................. G01R 31/02

OTHER PUBLICATIONS

IBM TDM Feb. 1984 No. 9, pp. 4457–4462: "Robot Position and Orientation Sensor".

*Primary Examiner*—Vinh P. Nguyen
*Attorney, Agent, or Firm*—Richard A. Tomlin; William J. Dick

[57] ABSTRACT

Disclosed is a Mini Probe Positioning Actuator which is low in cost and mass, capable of high accelerations, relatively long stroke and compact packaging. The probe positioning actuator is composed of a pair of substantially parallel cantilevered beams, each beam being comprised of flexible, signal carrying cable formed of a polyimide composition which allows for the probe tip to be suspended from and form part of the armature of the actuator. The armature also includes a pair of oppositely wound coils intermediate the beams, which coils coact electromagnetically with a pair of spaced apart but fixedly positioned (relative to the coils/ armature) magnets forming a motor for effecting armature and thus probe tip movement. The light mass of the coils and armature and the dual functional purpose of the suspension beams serves to make the probe actuator highly accurate and sensitive while allowing for reliable operation.

12 Claims, 5 Drawing Sheets

MINIATURE PROBE POSITIONING ACTUATOR

CROSS-REFERENCES TO RELATED APPLICATIONS

This application is related to co-pending application Ser. No. 08/451,635 filed on May 26, 1995, (the same date as this application) and bearing the title .Probe Positioning Actuator., our designation BC9-95-018.

BACKGROUND OF THE INVENTION & STATE OF THE PRIOR ART

1. Field of the Invention

The present invention relates to actuators and more particularly relates to miniature actuators for use with probes employed in conjunction with electrical circuit testing on miniature devices such as integrated circuit chips, wherein the probe must move in a predetermined, accurate and rapid fashion into engagement with the electrical circuit under test.

2. Description of Related Art

New technology has increased the density of very large scale integration electronic circuits (VLSI) which requires a reliable probing machine to perform fast and accurate electrical testing. For example, a single substrate may contain as many as 150,000 test points, and the circuits formed between selected points may require probing for different electrical properties at different stages of the manufacturing process.

One of the crucial components of the probing machine is the probe positioning actuator. The actuator moves the probe tip in a vertical direction (Z-Axis) in order to contact with the test pads of the circuitry to perform the desired or selected test. As can be imagined from the forgoing, competitive probe positioning actuators should be reliable, have low or no maintenance and if required be easy to maintain, should preferably have low or no wear parts or parts that are subject to fatigue, and should have excellent repeatability of position and capable of moving at high speeds without damage to the substrate (semi-conductor chip).

Machines for probing and testing electrical circuits in integrated circuit chips usually include a stationary base member and an X-Y table mounted thereon for movement relative to the base member. A fixture or jig is conventionally provided attached to the table, the fixture being employed to accurately hold, position and vertically elevate the chip into contact with one or more probes for chip monitoring and test. In this arrangement the probes are fixedly connected to the base member, or if monitoring (testing) of the chip is to occur on opposite sides thereof simultaneously, other jig and fixture means are provided for swinging the testing probes into position. Because of the mass of the fixture or jig, (as compared with the mass of the probes), chip movement into engagement with the probe(s) is slow. Moreover, with fixed probes, it is extremely difficult to adjust the probe tips to ensure approximate uniformity of pressure when the chip engages the probes. Various means have been provided in an attempt to ensure substantially uniform probing force. These include planarization of both the probe tips and/or the surface of the chip under test.

Other ways, such as pre-loading the probe arms, ensuring a constant deflection distance of the probe arms etc. have been partially successful but have resulted in differences when the chip surface is uneven, or the probe tip subscribes an arc when the chip comes into contact with the probe or probes effecting scratching of the chip surface resulting in damage to the delicate electrical circuits therein. In other instances, uncontrolled or poorly controlled probe tip forces on the chip surface can result in damage to either or both of the chip surface and probe tip.

Other methods of control of the probe arm is to provide an actuator for each of the probes and move the chip under test only in the X-Y plane. Some of the actuators employed include that shown in U.S. Pat. No. 5,153,472. While this probe actuator overcomes the problems of non linear probe movement in the Z-axis, and meets the requirements of controllable probe force, it suffers from two major defects: (1) the ball bearing structure is subject to wear and stress concentration, resulting in non-repetitive or repeatable accurate alignment of the probe tip over a period of time, and (2) the high mass of the tip armature structure makes probe tip control difficult unless probe movement is deliberately made slow so as to prevent inadvertent high impact loads on the chip.

Other actuator designs have included air bearings for their movement. However, air bearings are not stable at high speeds because of turbulent flow.

Other problems relating to electrical signal interference when measuring with the probe tip, using electrically powered actuators, are overcome as shown in U.S. Pat. No. 4,123,706 by the use of fluid actuation. However, the twin beam actuator shown in the '706 patent has damping problems with fast probing contacts at high speeds. Moreover, despite the characterization of "no arc" movement of the probe, it is believed that the probe tip of the '706 patent has to move in some arc which creates some difficulty in initial positioning of the actuator/probe tip. Moreover, because the principal actuation is in one direction or uni-sided, probe bounce may occur at high speeds and force.

SUMMARY OF THE INVENTION

In view of the above, it is a principal object of the present invention to provide an improved actuator/probe assembly for testing electrical circuits and the like on semi-conductor chips.

A further object of the present invention is to provide a low mass, high speed actuator for a probe which inherently is capable of substantially perpendicular movement with respect to the chip surface to inhibit probe scrubbing of the delicate surface of the chip under test.

Another object of the present invention is to provide a low mass, high speed actuator for semi-conductor chip testing in which there are relatively no wearing parts so that the life of the actuator in use is substantially indefinite under normal usage conditions.

Yet another object of the present invention is to provide an actuator for a probe for semi-conductor chip testing in which the structure is such that power and signal leads may be carried in the same cabling.

In the illustrated instance, the forgoing is accomplished by providing an actuator for accurately and selectively positioning a probe into electrical contact with an electrical circuit associated with a device and for testing the same. The actuator is adapted for receipt into an X-Y positioning apparatus for precisely locating the actuator in a plane parallel to the plane of the device with the circuit being tested so that the actuator is positioned in overlapping relation to the device being tested, the device being held in a predetermined position by any conventional means such as a jig or fixture. The actuator assembly comprises a frame including a separator, and at least one pair of spaced apart, laterally extending, flexible beams attached to the separator. A nonmagnetic armature is attached adjacent or approximate the extended terminal ends of the beams, and a probe is attached to the armature for contacting selected points in the electrical circuit associated with the device being tested. The heart of the actuator includes a pair of coils arranged so that their axes are spaced apart but in parallel relation to one another, the coils being insulated and connected to one another, at least one of the coils being connected to either one of the beams and/or the armature. (In the preferred embodiment, both coils are connected to the armature.) This places the 'motor' portion of the actuator adjacent the armature and probe and as will be discussed hereinafter, permits accurate and repeatable, fast control of not only probe tip position but probe tip movement. To complete the motor portion of the actuator, means, carried by the frame, create a magnetic field across at least part of the coils, whereby upon energization of the coils, deflection of the armature (and thus the beams) occurs, effecting movement of the probe into contact with selected portions of the electrical circuit associated with the device being tested. The magnetic field is created, in the present instance, by a pair of permanent magnets mounted on the frame, perpendicular to the axis of the coils and on opposite sides thereof, the magnets being magnetically oriented so that the sides thereof facing the coils are of opposite polarity, thereby creating the desired magnetic field across the coils.

Other features of the actuator include at least one of the flexible beams being composed of a flexible circuit material carrying at least some electrical conductors for at least one of the probe and coils.

Another feature of the actuator of the present invention is the inclusion of sensor means associated with the probe for indicating at least probe deflection when the coils are energized.

Other objects and a more complete understanding of the invention may be had by referring to the following description taken in conjunction with the accompanying drawings in which:

DESCRIPTION OF THE ILLUSTRATIVE EMBODIMENT

Figure 1:
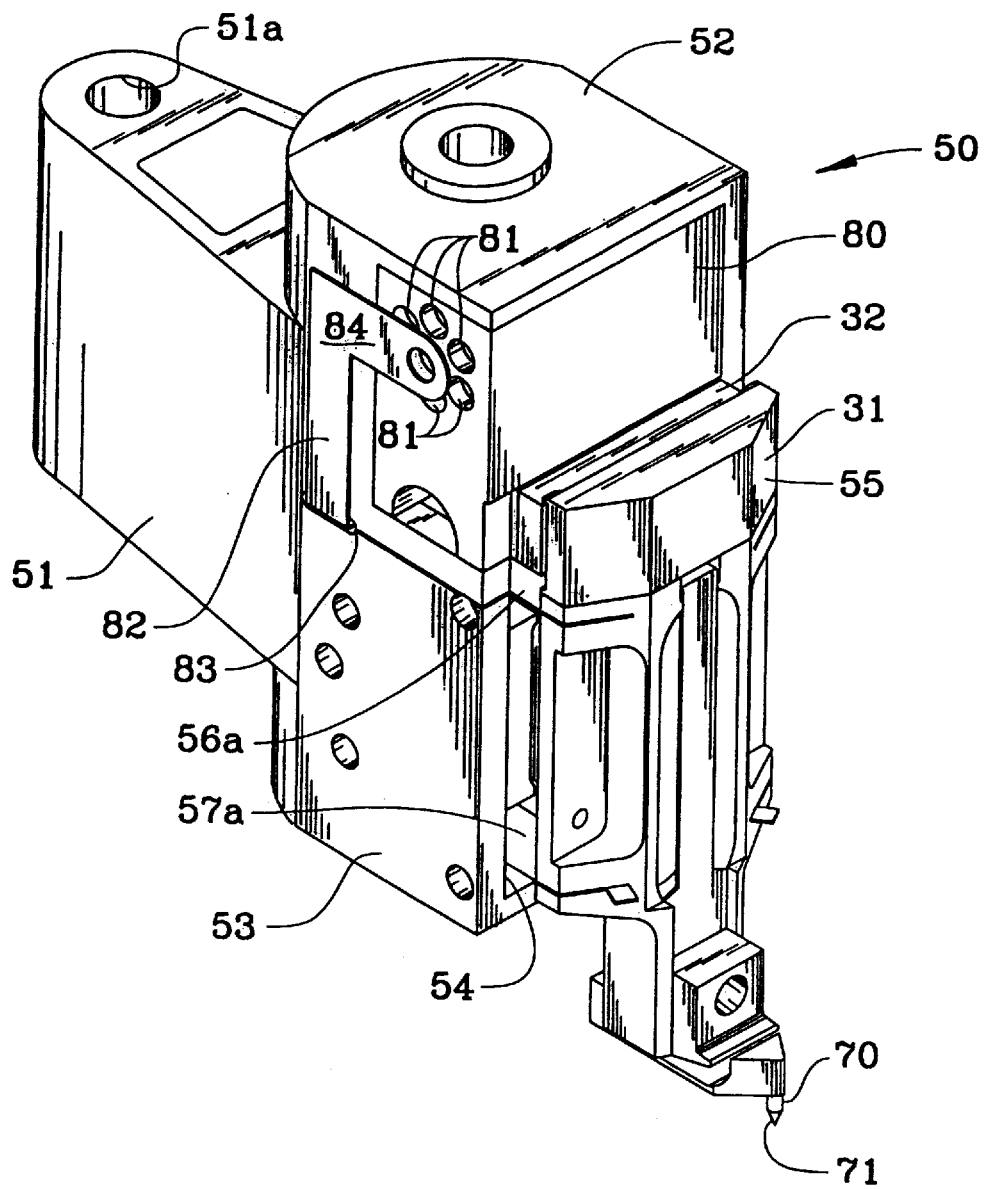
FIG. 1 is an enlarged isometric view of an actuator constructed in accordance with the present invention with the covers in place.
Figure 5:
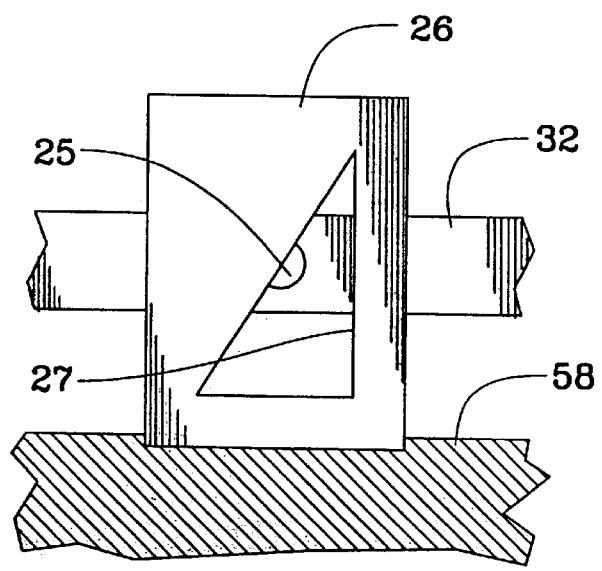
FIG. 5 is an enlarged, fragmentary, frontal elevational view taken along lines 5—5 of FIG. 3.

Turning now to the drawings and especially FIGS. 1 and 5 thereof, an actuator 50, constructed in accordance with the present invention, is shown therein.

Figure 6:
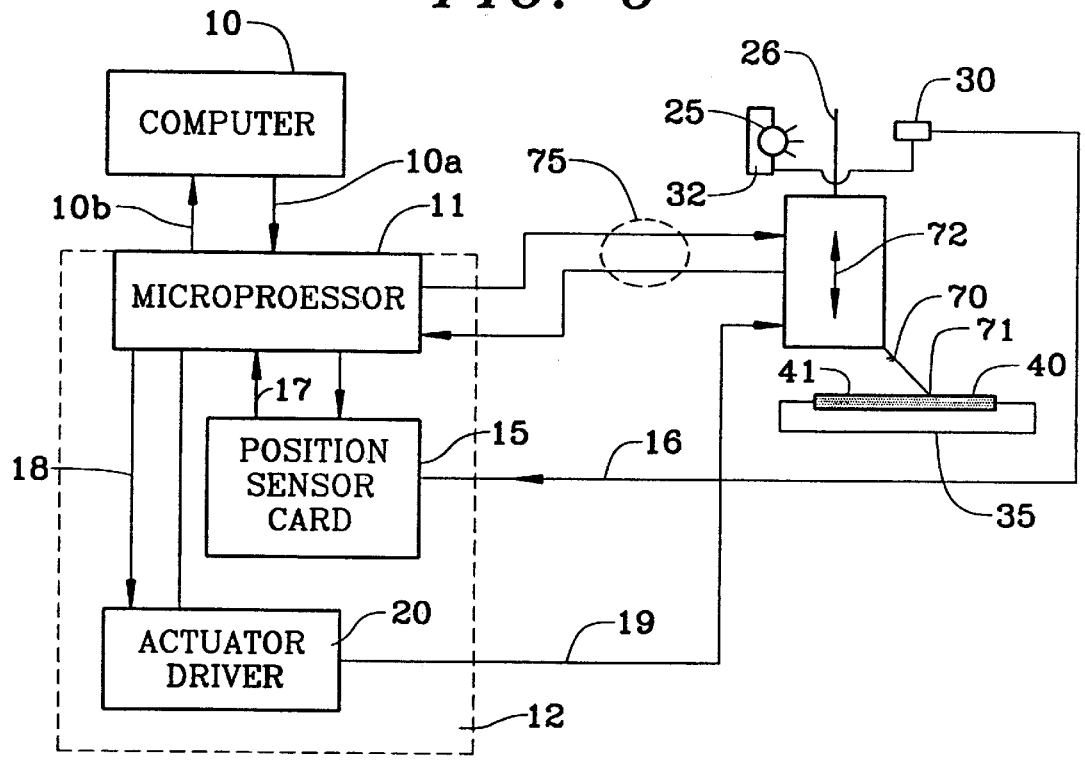
FIG. 6 is a schematic representation of an exemplary probe system incorporating the actuator mechanism of the present invention.

From a system standpoint, and as shall be more fully explained hereinafter, as illustrated best in FIG. 6, the actuator 50 includes a probe 70, the tip 71 of which is adapted to engage circuits or pads therefor and the like on the surface 41 of a work piece, for example a device such as a semiconductor chip 40. The device or chip 40 is held, in a conventional manner, by a jig or fixture (not shown) onto an X-Y table 35. The actuator is also adapted for receipt onto a jig or fixture associated with the X-Y table 35 (but not connected thereto) for precisely locating the actuator 50 in a plane parallel to the plane of the device with the circuit being tested so that the probe tip of the actuator is positioned in superimposed, overlapping relation to the device being tested. The motion of the actuator 50 to effect engagement of the tip 71 of the probe 70 against the surface 41 of the device or chip 40 includes a computer 10, which receives a control card 12 for operation with the computer 10, and a probe position sensor 30. The system and its operation will be explained more fully hereinafter. Suffice at this point in the description to note that the actuator 50 serves to move the probe 70 in the direction of the arrow 72 into and out of engagement with the surface 41 of the device 40 under test.

Turning now to FIG. 1, the actuator 50 includes rear and upper cover portions, 51, 52 respectively. The rear cover 51 serves as an attachment housing for connection and precise location of the actuator 50 with respect to the device 40 under test, and is provided with suitable apertures 51a to permit capture by a fixture (not shown) for precise location with respect to the X-Y table 35 (FIG. 6). The upper cover 52 serves as a protection for the internal conductors and partially for the motor structure, hereinafter described. Both the upper and rear cover portions, 51,52 are connected to a U-shaped, light weight actuator support member 53 which serves, in the present instance, as a frame, a separator for parts of the actuator mechanism, and a cover therefor. It should be recognized that the frame 53 in conjunction with the upper and rear covers, 52, 51 form a cavity 54 for receipt of the probe motor and probing mechanism. 55 of the actuator 50.

Figure 2:
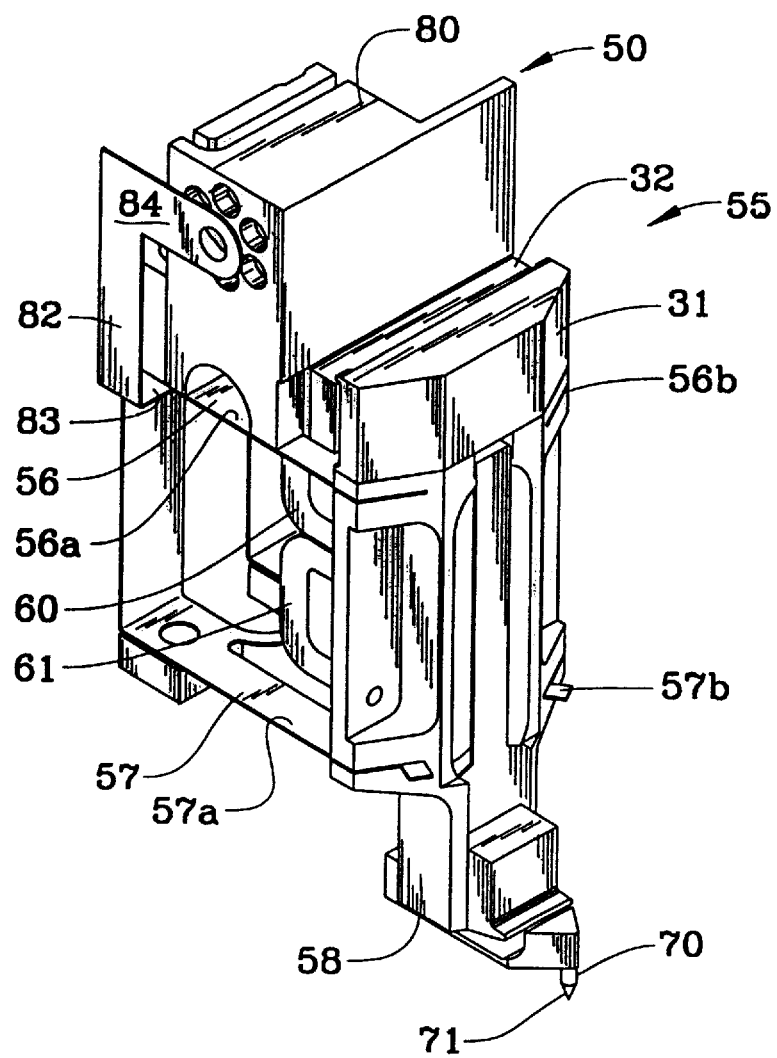
FIG. 2 is an isometric view similar to FIG. 1 except that the covers of the actuator have been removed to better illustrate the interior parts thereof.

FIG. 2 illustrates the probe motor and probing mechanism 55 removed from the covers 51, 52 and frame 53. In accordance with the invention, the probe motor and probing mechanism 55 of the actuator 50 comprises at least a pair of spaced apart, laterally extending, resilient and flexible beams 56,57, each of which, in the illustrated instance, are bifurcated to form beam legs 56a, 56b and 57a, 57b respectively. (See FIGS. 2 & 4). As shown best in FIGS. 2 & 3, the extended ends of the beams 56 and 57 are connected to (by bonding or the like) an armature 58, composed preferably of a non-magnetic material such as Ultem® (a trademark of General Electric Corp.), a polyetherimide resin (1000 series resin). At the lower portion 58a of the armature 58 is connected the probe 70 having a probe tip 71, adapted to engage selected circuits and the like on the surface 41 of a device such as the semiconductor chip 40 illustrated schematically in FIG. 6.

The beams 56 and 57 are formed of a polyimide and copper flex cable such as Kapton® (a Registered Trademark of E.I. DuPont Corp.) and sold by E.I. DuPont Corp. As shown best in FIG. 4, the beams 56 and 57 include a plurality of conductors 56c and 57c respectively. The beams may terminate in any desired construction. For example, as shown in FIG. 2, they may join together in a junction block and the like 80 having a plurality of conductor connections 81 therein for external connection to power sources, and as will be more completely described with regard to FIGS. 6 & 7, connection to the control card 12 associated with computer 10. As shown, the junction block 80 is mounted on an angle brace or strap 82 having a cross member part 83 which underlies beam 56 and by apertured leg 84 may be connected as by a machine screw (not shown) to a like aperture in the junction block 80. As illustrated best in FIG. 1, the cross member 83 of the strap or angle brace 82 may be joined to the frame 53.

Figure 3:
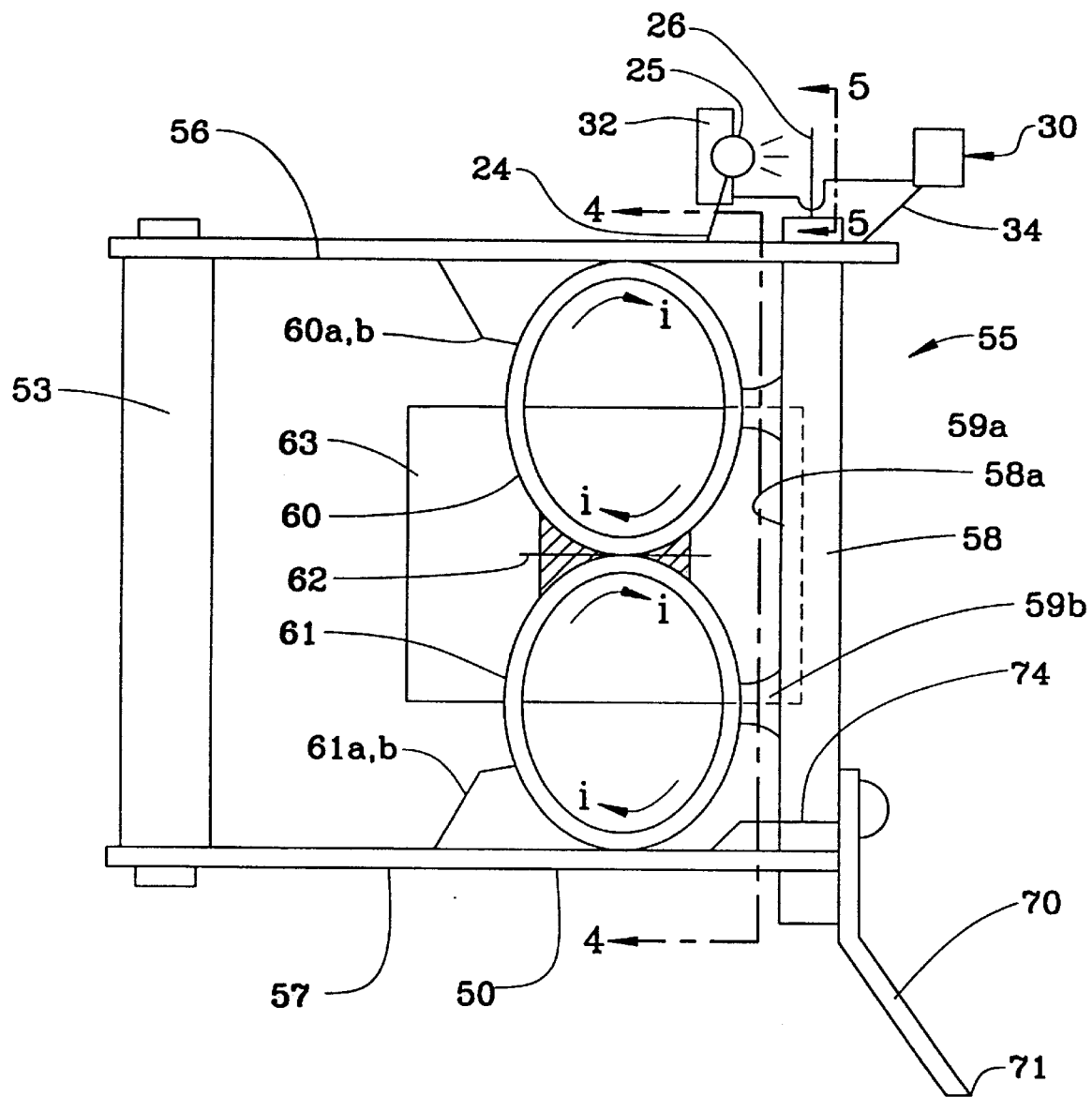
FIG. 3 is an enlarged, fragmentary schematic representation of the actuator of FIGS. 1 and 2 and in side elevation, with portions of the apparatus removed and simplified to aid in viewer understanding.

As shown in FIG. 3, closely adjacent and bonded as at 59a and 59b to the armature 58, on the rear side 58a thereof, intermediate the beams 56 and 57 are a pair of electrically energizeable coils 60, 61, mounted so that their axes are spaced apart but are in parallel relation with each other. As shown best in FIG. 3, the coils are insulated from one another by an insulator 62, and bonded to one another by any suitable bonding medium (which may in fact serve as the insulator, if desired) at their radial extents. The coils preferably have their terminal leads, 60a, 60b and 61a, 61b joined to current carrying conductors, e.g. 56c1, 56c2 and 57c1 and 57c2 of the respective beams 56 and 57. (FIGS. 3 & 4).

Figure 4:
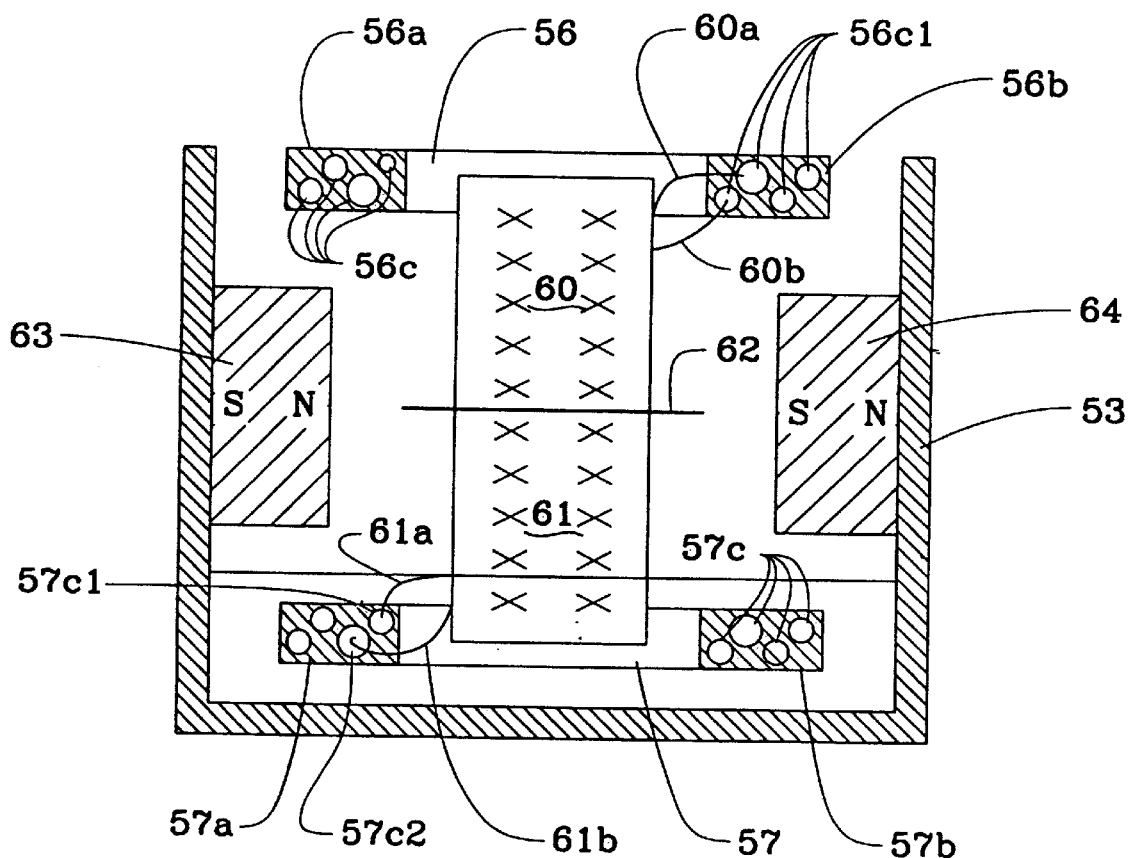
FIG. 4 is a fragmentary, schematic, sectional view taken along lines 4—4 of FIG. 3, as if FIG. 3 were not fragmented, and with certain other portions of the apparatus removed to more easily understand the operational structure of the actuator of the present invention.

To complete the motor portion of the probe motor and probing mechanism of the actuator 50, a pair of spaced apart permanent magnets 63, 64 are mounted on the interior walls of the U-shaped frame 53 (FIG. 4). The magnets 63, 64 create a magnetic field across at least part of the coils 60, 61, whereby upon energization of the coils, deflection of the beams 56, 57 and the armature 58 occurs, effecting movement of the probe 70 into contact with portions of the selected electrical circuit on the chip 40. As may be noted in FIGS. 3 & 4, the magnets 63 and 64 preferably have a vertical extent sufficient that ½ of each of the coils 60, 61 are located in the magnetic field created by the magnets, when the armature 58 is at rest. Moreover, as best shown in FIG. 3, the current "I" flow through each of the coils, upon energization, is in the opposite direction. For example, the current "I" flow through coil 60 is clockwise while the current "I" flow in coil 61 is in the counter clockwise direction. However, the direction of the current "I" flow in each of the coils, at their juncture (or along insulator 62) is in the same horizontal direction causing a common field interaction with the magnetic field created by the two magnets 63, 64. In this manner, the current through each of the coils, during energization, may remain substantially constant to achieve a predetermined deflection of the armature 58 and thereby the probe 70, the direction of probe movement being dependent upon the direction of current flow in coils 60, 61. (It should be recognized that if the current "I" flow in coil 60 is counter clockwise then the current "I" flow in coil 61 should be clockwise, as viewed in FIG. 3 to achieve deflection in one direction. Thus the same action, just directionally opposite with respect to probe movement, will occur if the current "I" is caused to flow in each of the coils, in the opposite direction to that noted above.)

It will be recognized to one skilled in the art, it is preferred that the exact position of the probe tip 71, relative to the semi-conductor chip 40, be known. To this end, a position sensing apparatus may be attached to the frame 53 in such a manner to detect the armature 58 position under varying current deflection conditions and controlled in a manner by suitable feedback to permit raising or lowering, in response to armature position, the current applied to the coils. As shown schematically in FIGS. 3 & 6, a light source 25, such as an infra red emitting diode, is located on one side of a flag or tell-tale 26 which is attached to the armature 58 so that as the armature is elevated or depressed in response to the current applied to the coils 60, 61, a greater or lesser amount of light will be detected from the light source 25 by the sensor 30. The amount of light sensed by the detector or sensor 30 may be varied by the flag or tell-tale 26 having a shaped opening therethrough, for example the opening 27 being in the shape of a triangle such as illustrated in FIG. 5, so that as the armature 58 descends less light will be detected by the sensor or in the illustrated instance a photo-diode sensor 30, and when it ascends, more light will be detected. (The arrangement may also be the opposite, merely depending upon the way in which the user decides to set the sensor output, i.e. more light higher or diminished output).

As shown best in FIGS. 1 & 2, the sensor 30 may be covered by a simple cover 31 adapted to be raised and lowered as the armature 58 reciprocates in the direction of arrow 72. Moreover, as best shown in FIGS. 1 & 6, the sensor 30 and light 25 may be carried by a sensor mounting block 32 and electrically connected, as shown schematically in FIG. 3 to a current carrying wire pair 24 and 34 and then into conductors in the upper flexible beam 56. The output of the sensor 30 may be applied through wire pair 34 to the flexible beam 56, and as shown schematically in FIG. 6, applied to a control card 12, carried by a computer 10, e.g. as through lead 16.

The computer 10 is preferably of the type that can accommodate plug in boards or cards which include local or board carrying micro-processors. The IBM micro-channel architecture machines, sold under the trade name PS/2®, are ideal for this kind of activity. The micro-channel architecture machines are capable of bus-mastering (wherein the microprocessor on the board communicates with the computer's CPU, controls its own local bus and function, and is capable of other interrelated as well as other independent actions). In this connection, the control card 12 preferably includes a position sensor card 15 and an actuator driver card 20, all under control of a local microprocessor 11. The microprocessor 11 may be any convenient one readily available on the open market, for example a Texas Instrument TMS320C30. The position sensor card 15 receives a sense signal from the sensor 30 (FIG. 6) over line 16, which, after suitable modification is in turn fed back to the microprocessor 11 by line 17 for processing (e.g. required sense, amplification, etc.), as will be explained hereinafter with respect to FIG. 7. Suffice at this juncture, that the processor 11 outputs a signal over line 18 to actuator driver 20 which is applied through conductor 19 to the motor coils 60, 61. The actuator driver 20 is in actuality a current amplifier of suitable output sufficient to effect the necessary current flow to move the armature 58 and thus the probe 70 into proper position.

Figure 7:
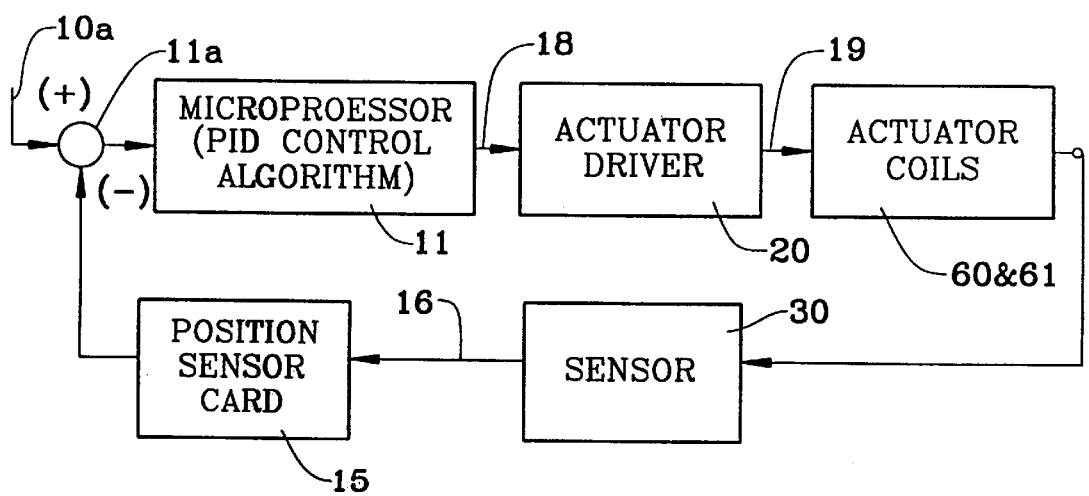
FIG. 7 is a schematic or block diagram representation of the controller for energization of the 'motor' portion of the actuator of the present invention.

The system may employ any of a number of standard control algorithms for the actuator motor control. Proportional Integral Derivative (PID) control algorithms are well known in the industry and may be employed for suitable feedback control. However, because the actuator 50 is extremely small and has a very light weight, on the order of 0.3 grams, elaborate control algorithms are not required, even though desirable. As shown in FIG. 7, the microprocessor 11 may contain the PID control algorithm. Examples of the PID algorithm are explained in the book "Feedback Control System" by Charles L. Phillips and Royce D. Harbor, Prentice Hall, 1988, pages 239 et. seq. The computer 10 provides a suitable machine initialization signal over line 10a (FIGS. 6 & 7) and tells the microprocessor 11, inter alia, what measurements to perform, e.g. resistance, capacitance, where the pad on chip is located, and how much deflection is required of the armature 58 to effect probe 71 contact with the surface 41 of device or chip 40. The microprocessor 11, may, for example, put out a positive (+) signal over line 10a to a summing junction or amplifier 11a, associated with the microprocessor 11, to which the feedback signal from the sensor 30 and position sensor card 15 outputs a negative (−) signal. This means that an error signal is applied to the microprocessor 11, which error signal is appropriately handled by the PID control algorithm contained in the microprocessor.

Because the microprocessor 11 may operate substantially independently of the computer 10 CPU, it is preferable that the instructions sent by the computer 10 relating to the probe measurements, settings, and the like be handled by the microprocessor 11. As illustrated, the computer provides this necessary initial information to the microprocessor 11 over line 10b while receiving any feedback data or information over line 10b. These signals, to and from the probe 70, are carried by selected conductors 57c in the lower beam 57, through connecting wires 74 (FIG. 3) to the probe 70, and through wire pair 75 (FIG. 6) to and from the microprocessor 11.

From the forgoing, it should be recognized that the structure provided by the probe actuation scheme of the present invention allows for extremely small structures, which because of the lower mass and the ability to place the structures in very tight and close situations, permits of faster acting and more reliable probing of devices under test.

Although the invention has been described with a certain degree of particularity, it should be recognized that elements thereof may be altered by person(s) skilled in the art with out departing from the spirit and scope of the invention as hereinafter set forth in the following claims.

What is claimed is:

1. An actuator for accurately and selectively positioning a probe into electrical contact with an electrical circuit associated with a device and for testing the same, said actuator comprising in combination:
    a frame including a separator means;
    at least one pair of spaced apart, laterally extending, flexible beams attached to said separator means;
    an armature attached to the extended terminal ends of said beams;
    a probe attached to the armature for contacting selected points in the electrical circuit associated with said device being tested;
    a pair of coils arranged so that their axes are spaced apart but in parallel relation to one another, said coils being insulated from one another, at least one of said coils being connected to one of a beam and armature,
    means, carried by said frame, creating a magnetic field across at least part of said coils, whereby upon energization of said coils, deflection of said beams and said armature occurs, effecting movement of said probe.

2. An actuator for accurately and selectively positioning a probe into electrical contact with an electrical circuit in accordance with claim 1 wherein at least one of said flexible beams comprises flexible circuit material carrying at least some electrical conductors for at least one of the probe and coils.

3. An actuator for accurately and selectively positioning a probe into electrical contact with an electrical circuit in accordance with claim 2 wherein the other one of said flexible beams comprises flexible circuit material carrying at least some electrical conductors for one of the probe and coils.

4. An actuator for accurately and selectively positioning a probe into electrical contact with an electrical circuit in accordance with either claim 1, including sensor means associated with said probe for indicating at least the deflection of said probe upon energization of said coils.

5. An actuator for accurately and selectively positioning a probe into electrical contact with an electrical circuit in accordance with claim 4 including feedback control means for energizing said coils in response to said deflection.

6. An actuator for accurately and selectively positioning a probe into electrical contact with an electrical circuit in accordance with claim 1 wherein said means, carried by said frame, creating a magnetic field across at least part of said coils, comprises a pair of permanent magnets mounted on said frame, perpendicular to the axis of said coils and on opposite sides thereof, said magnets being magnetically oriented so that the sides thereof facing said coils are of opposite polarity, thereby creating said magnetic field across said coils.

7. An actuator for accurately and selectively positioning a probe into contact with a surface of a device for electrically testing the same, said device being adapted for receipt into an X-Y positioning apparatus, and said actuator being adapted for precise location in a plane parallel to the plane of the device being tested so that said actuator is positioned in superimposed, overlapping relation to the device being tested, comprising in combination:
    a frame,
    at least one pair of spaced apart, laterally extending, flexible beams attached to said frame, at least one of said beams carrying flexible conductors;
    an armature attached adjacent the extended terminal ends of said beams, said armature being composed of a non-magnetic material;
    a probe attached to the armature for contacting selected points on the surface of said device being tested;
    a pair of coils arranged so that their axes are spaced apart but in parallel relation to one another, said coils being insulated from one another but connected at their radial extent to one another, each of said coils being connected to one of a beam and armature,
    means, carried by said frame, creating a magnetic field across at least part of said coils, whereby upon energization of said coils, deflection of said beams and said armature occurs, effecting movement of said probe into contact with selected portions of the surface of the device being tested.

8. An actuator for accurately and selectively positioning a probe into contact with a surface of a device for electrically testing the same in accordance with claim 7 wherein at least one of said flexible beams comprises flexible circuit material carrying at least some electrical conductors therein, and at least one of the probe and coils being connected to selected ones of said conductors.

9. An actuator for accurately and selectively positioning a probe into electrical contact with an electrical circuit in accordance with claim 8 wherein the other one of said flexible beams comprises flexible circuit material carrying at least some electrical conductors for one of the probe and coils.

10. An actuator for accurately and selectively positioning a probe into contact with a surface of a device for electrically testing the same in accordance with claim 9 including sensor means associated with said probe for indicating at least the deflection of said probe when said coils are energized.

11. An actuator for accurately and selectively positioning a probe into contact with a surface of a device for electrically testing the same in accordance with claim 7 wherein said means, carried by said frame, creating a magnetic field across at least part of said coils, comprises a pair of permanent magnets mounted on said frame, perpendicular to the axis of said coils and on opposite sides thereof, said magnets being magnetically oriented so that the sides thereof facing said coils are of opposite polarity, thereby creating said magnetic field across said coils.

12. An actuator for accurately and selectively positioning a probe into contact with a surface of a device for electrically testing the same in accordance with claim 10 including feedback control means for energizing said coils in response to said deflection.

* * * * *